United States Patent
Seningen et al.

(10) Patent No.: US 10,191,086 B2
(45) Date of Patent: Jan. 29, 2019

(54) POWER DETECTION CIRCUIT

(71) Applicant: Apple Inc., Cupertino, CA (US)

(72) Inventors: Michael R. Seningen, Austin, TX (US); Zhao Wang, San Jose, CA (US); Ajay Bhatia, Saratoga, CA (US)

(73) Assignee: Apple Inc., Cupertino, CA (US)

( * ) Notice: Subject to any disclaimer, the term of this patent is extended or adjusted under 35 U.S.C. 154(b) by 134 days.

(21) Appl. No.: 15/079,364

(22) Filed: Mar. 24, 2016

(65) Prior Publication Data
US 2017/0276705 A1 Sep. 28, 2017

(51) Int. Cl.
*G11C 7/00* (2006.01)
*G01R 15/09* (2006.01)
*G01R 31/40* (2014.01)

(52) U.S. Cl.
CPC ............. *G01R 15/09* (2013.01); *G01R 31/40* (2013.01)

(58) Field of Classification Search
CPC .............................. G01R 15/09; G01R 31/40
USPC .................................................. 365/226, 228
See application file for complete search history.

(56) References Cited

U.S. PATENT DOCUMENTS

| | | | | |
|---|---|---|---|---|
| 3,995,232 A | * | 11/1976 | Laugesen | H03K 3/354 331/108 D |
| 5,307,319 A | * | 4/1994 | Kohketsu | G11C 5/147 365/189.05 |
| 5,523,978 A | * | 6/1996 | Yoon | G11C 5/143 365/226 |
| 5,637,991 A | * | 6/1997 | Brown | G05F 1/44 323/269 |
| 6,144,237 A | * | 11/2000 | Ikezaki | H03K 17/22 327/143 |
| 6,204,703 B1 | * | 3/2001 | Kwon | H03K 3/356008 327/143 |
| 6,205,071 B1 | * | 3/2001 | Ooishi | G11C 7/065 365/205 |
| 6,373,285 B1 | | 4/2002 | Konishi | |
| 6,549,032 B1 | * | 4/2003 | Shumarayev | G06F 1/24 326/33 |
| 6,882,570 B2 | * | 4/2005 | Byeon | G11C 5/147 365/185.18 |
| 6,995,598 B2 | * | 2/2006 | Hochschild | H03K 3/356113 326/81 |
| 7,005,908 B2 | | 2/2006 | Lee et al. | |
| 7,425,854 B2 | * | 9/2008 | Suzuki | H03K 17/223 327/143 |
| 7,786,770 B1 | * | 8/2010 | Liang | G06F 1/24 327/143 |
| 8,093,931 B2 | * | 1/2012 | Shinomiya | H03K 17/223 327/143 |
| 9,191,007 B1 | * | 11/2015 | Choy | H03K 3/356113 |
| 9,236,859 B1 | * | 1/2016 | Hong | H03K 17/687 |
| 9,257,973 B1 | * | 2/2016 | Shay | H03K 3/356104 |

(Continued)

*Primary Examiner* — Viet Q Nguyen
(74) *Attorney, Agent, or Firm* — Meyertons Hood Kivlin Kowert & Goetzel, P.C.

(57) ABSTRACT

An apparatus for detecting a change in a voltage level of a power supply is disclosed. An inverter coupled to a first power supply may generate a signal dependent upon a voltage level of a second power supply. A latch coupled to the first power supply may be set based on a first voltage level of the second power supply and a first value of the signal, and re-set based on a second voltage level of the second power supply and a second value of the signal different than the first value of the signal.

16 Claims, 7 Drawing Sheets

(56) References Cited

U.S. PATENT DOCUMENTS

| | | | | |
|---|---|---|---|---|
| 9,461,648 B1* | 10/2016 | Lee | ............... | H03K 19/018507 |
| 2002/0000834 A1* | 1/2002 | Ooishi | ............... | H03K 3/012 |
| | | | | 326/113 |
| 2003/0080787 A1* | 5/2003 | Yamauchi | ............... | G11C 7/20 |
| | | | | 327/108 |
| 2005/0035796 A1* | 2/2005 | Chun | ............... | H03K 3/356008 |
| | | | | 327/143 |
| 2005/0270077 A1* | 12/2005 | Kwon | ............... | H03K 17/223 |
| | | | | 327/143 |
| 2007/0257724 A1* | 11/2007 | Suzuki | ............... | H03K 3/35613 |
| | | | | 327/333 |
| 2007/0268059 A1 | 11/2007 | Sakaguchi et al. | | |
| 2008/0025075 A1* | 1/2008 | Kumamaru | ............... | G11C 5/147 |
| | | | | 365/156 |
| 2010/0061121 A1* | 3/2010 | Udagawa | ............... | H02M 3/335 |
| | | | | 363/16 |
| 2010/0313700 A1* | 12/2010 | Mannle | ............... | G05G 1/38 |
| | | | | 74/512 |
| 2011/0175664 A1 | 7/2011 | Inoue et al. | | |

* cited by examiner

POWER DETECTION CIRCUIT

BACKGROUND

Technical Field

Embodiments described herein are related to the field of integrated circuits, and more particularly to the detection of power supply voltage level changes.

Description of the Related Art

Computing systems may include multiple integrated circuits, each of which may include different circuits, such as, e.g., a processor, a radio frequency transceiver, and the like. To reduce chip count for mobile and wearable applications, computing systems may be integrated on a single integrated circuit. A computing system implemented in such a fashion is commonly referred to as a system-on-a-chip or "SoC."

Different circuit blocks included in an SoC may employ different power supply voltage levels. In such cases, a Power Management Unit (PMU) may be used in conjunction with multiple voltage regulator units to generate the desired power supply voltage levels for the circuit blocks included in the SoC. During power-up operations, the various power supply voltage levels may reach their respective desired values at different times. As such, the different circuit blocks may be ready to commence their respective operations once their respective power supply voltage levels have reached their desired values.

SUMMARY OF THE EMBODIMENTS

Various embodiments of a current monitoring unit are disclosed. Broadly speaking, a circuit and a method are contemplated in which an inverter is coupled to a first power supply and may be configured to generate a signal dependent upon a second power supply. A latch coupled to the first power supply may be configured to store a first value dependent upon a first voltage level of the second power supply and a first value of the signal. The latch may be further configured to store a second value dependent upon a second voltage level of the first power supply and a second value of the signal, where the second value of the signal is different than the first value of the signal.

In another embodiment, the first voltage level of the second power supply may be greater than the second voltage level of the second power supply. In a further embodiment, the first voltage level of the second power supply may be less than the second voltage level of the second power supply.

In another non-limiting embodiment, a third voltage level of the first power supply may be greater than the first voltage level of the second power supply. In a further embodiment, the inverter may include a device whose source terminal is coupled to the first power supply and whose control terminal is coupled to a storage node in the latch.

BRIEF DESCRIPTION OF THE DRAWINGS

The following detailed description makes reference to the accompanying drawings, which are now briefly described.

Figure 1:
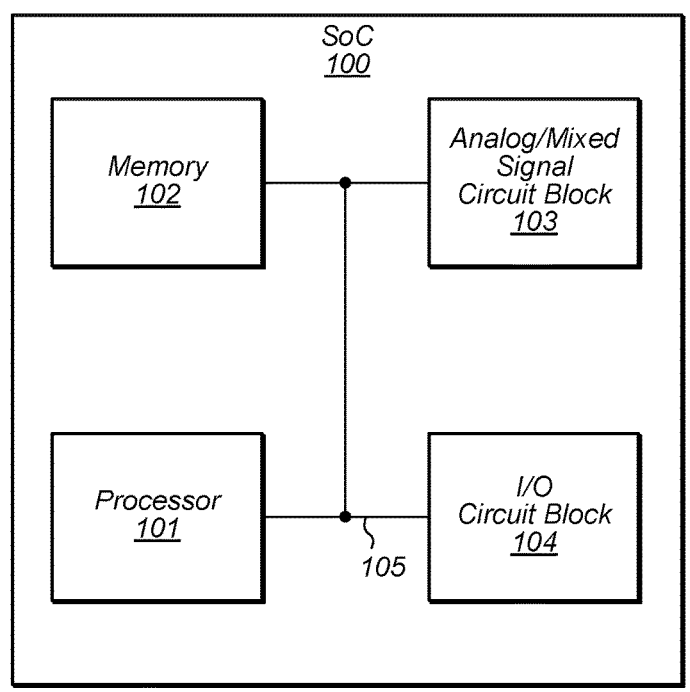
FIG. 1 illustrates an embodiment of a system-on-a-chip.

While the disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form illustrated, but on the contrary, the intention is to cover all modifications, equivalents and alternatives falling within the spirit and scope of the present disclosure as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. § 112, paragraph (f) interpretation for that unit/circuit/component. More generally, the recitation of any element is expressly intended not to invoke 35 U.S.C. § 112, paragraph (f) interpretation for that element unless the language "means for" or "step for" is specifically recited.

DETAILED DESCRIPTION OF EMBODIMENTS

A system on a chip (SoC) may include one or more circuit blocks, such as, e.g., a processor, which may integrate the function of a computing system onto a single integrated circuit. Depending on their respective intended functions, each circuit block may be designed to operate at different clock frequencies and/or different power supply voltage levels.

To accommodate the different power supply voltage levels, SoCs may include a power management unit (PMU) that may generate the desired power supply voltage levels using voltage regulators or other suitable circuits, such as, a buck regulator, for example. In some cases, it may be desirable for a particular circuit block to monitor the voltage level of the power supply of a related circuit block. Such monitoring may be used to issue resets, other otherwise change the operation of the particular circuit block when it is determined that the voltage level of the power supply of the related circuit block is not within its intended operating range.

Methods for monitoring the voltage level of a power supply may consume DC power and employ complex analog circuitry, making it difficult to implement in all but a select few circuit blocks within an SoC due to area and power concerns. The embodiments illustrated in the drawings and described below may provide techniques to monitor the voltage level of a power supply while limiting power consumption and circuit complexity.

A block diagram of an SoC is illustrated in FIG. 1. In the illustrated embodiment, the SoC 100 includes a Processor 101 coupled to Memory 102, and Analog/Mixed-Signal Circuit Block 103, and I/O Circuit block 104 through internal bus 105. In various embodiments, SoC 100 may be configured for use in a mobile computing application such as, e.g., a tablet computer or cellular telephone.

Processor 101 may, in various embodiments, be representative of a general-purpose processor that performs computational operations. For example, Processor 101 may be a central processing unit (CPU) such as a microprocessor, a microcontroller, an application-specific integrated circuit (ASIC), or a field-programmable gate array (FPGA). In some embodiments, Processor 101 may include one or more register files and memories. Processor 101 may also be a computing complex having one or more processors or processor cores therein.

In some embodiments, processor 101 may implement any suitable instruction set architecture (ISA), such as, e.g., the PowerPC™ ARM™ or x86 ISAs, or combination thereof. Processor 101 may include one or more bus transceiver units that allow processor 101 to communication to other functional blocks within SoC 100 such as, memory block 102, for example Memory 102 may include any suitable type of memory such as a Dynamic Random Access Memory (DRAM), a Static Random Access Memory (SRAM), a Read-only Memory (ROM), Electrically Erasable Programmable Read-only Memory (EEPROM), a FLASH memory, or a Ferro-electric Random Access Memory (FeRAM), for example. In some embodiments, Memory 102 may be configured to store program code or program instructions that may be executed by Processor 101. Memory 102 may, in other embodiments, be configured to store data to be processed, such as graphics data, for example.

It is noted that in the embodiment of an SoC illustrated in FIG. 1, a single memory is depicted. In other embodiments, any suitable number of memory blocks and memory types may be employed.

Analog/Mixed-Signal Circuit Block 103 may include a variety of circuits including, for example, a crystal oscillator, a phase-locked loop (PLL) or delay-locked loop (DLL), an analog-to-digital converter (ADC), and a digital-to-analog converter (DAC) (all not shown). In other embodiments, Analog/Mixed-Signal Circuit Block 103 may be configured to perform power management tasks with the inclusion of on-chip power supplies, voltage regulators, and clock frequency scaling circuitry. Analog/Mixed-Signal Circuit Block 103 may also include, in some embodiments, radio frequency (RF) circuits that may be configured for operation with cellular telephone networks.

I/O Circuit Block 104 may be configured to coordinate data transfer between SoC 100 and one or more peripheral devices. Such peripheral devices may include, without limitation, storage devices (e.g., magnetic or optical media-based storage devices including hard drives, tape drives, CD drives, DVD drives, etc.), audio processing subsystems, graphics processing subsystems, or any other suitable type of peripheral devices. In some embodiments, I/O Circuit Block 104 may be configured to implement a version of Universal Serial Bus (USB) protocol or IEEE 1394 (Firewire®) protocol, and may allow for program code and/or program instructions to be transferred from a peripheral storage device for execution by Processor 101.

I/O Circuit Block 104 may also be configured to coordinate data transfer between SoC 100 and one or more devices (e.g., other computing systems or SoCs) coupled to SoC 100 via a network. In one embodiment, I/O Circuit Block 104 may be configured to perform the data processing necessary to implement an Ethernet (IEEE 802.3) networking standard such as Gigabit Ethernet or 10-Gigabit Ethernet, for example, although it is contemplated that any suitable networking standard may be implemented. In some embodiments, I/O Circuit Block 104 may be configured to implement multiple discrete network interface ports.

It is noted that the SoC illustrated in FIG. 1 is merely an example. In other embodiments, different circuit blocks and different configurations of circuit blocks may be possible dependent upon the specific application for which the SoC is intended. It is further noted that the various circuit blocks illustrated in SoC 100 may operate at different clock frequencies, and may require different power supply voltages.

Figure 2:
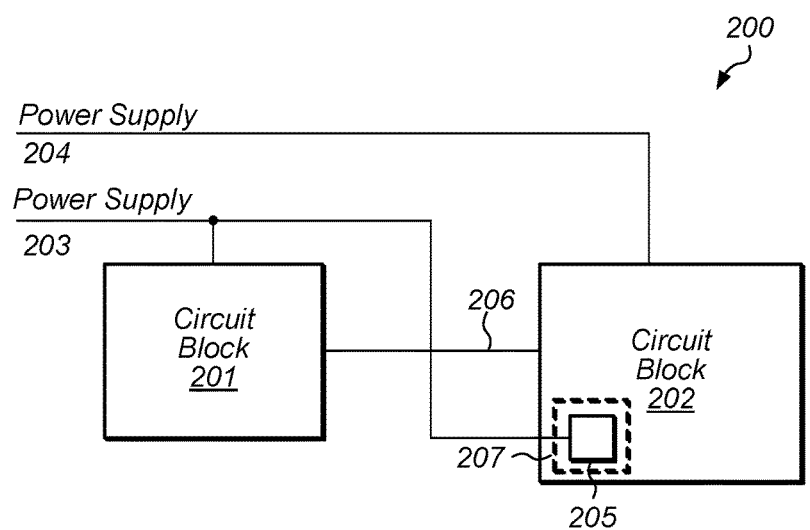
FIG. 2 illustrates an embodiment of a portion of a system-on-a-chip.

A block diagram depicting an embodiment of a portion of an SoC in illustrated in FIG. 2. In the illustrated embodiment, system 200 includes Circuit Block 201 and Circuit Block 202. In various embodiments, Circuit Block 201 and Circuit Block 202 may correspond to any of Memory 102, Analog/Mixed Signal Block 103, Processor 101, or I/O Circuit Block 104 as illustrated in FIG. 1.

Circuit Block 201 is coupled to Power Supply 203, and Circuit Block 202 is coupled to Power Supply 204. In some embodiments, voltage levels for Power Supply 203 and Power Supply 204 may be generated by voltage regulators (not shown) included in system 200, or may be generated by circuits external to system 200. A voltage level of Power Supply 203 may, in various embodiments, be less than, greater than, or substantially equal to a voltage level of Power Supply 204.

Circuit Block 201 is further coupled to Circuit Block 202 via signal 206. During operation, Circuit Block 201 may send data to and receive data from Circuit Block 202. Such data may, in various embodiments, include control signals instructing one of Circuit Blocks 201 and 202 to perform certain functions, such as, a reset, for example. Although a single signal is depicted in the embodiment illustrated in FIG. 2, in other embodiments, any suitable number of signals may be employed.

Circuit Block 202 includes power detection circuit 205, which is coupled to Power Supply 203. In various embodiments, power detection circuit 205 may be configured to monitor the voltage level of Power Supply 203. During operation, power detection circuit 205 may detect when the voltage level of Power Supply 203 falls below a predetermined threshold level. In response to such a detection, power detection circuit 205 may signal other circuits included in Circuit Block 202 to perform one or more operations. For example, Circuit Block 202 may send a reset signal to Circuit Block 201, or other circuit blocks included in a computing system in response to the voltage level of Power Supply 203 falling below the predetermined threshold level.

In some embodiments, power detection circuit 205 may be included in Security Circuit 207. As described below, in more detail, Security Circuit 207 may perform one or more actions in response to a change in the output of power detection circuit 205. For example, Security Circuit 207 may trigger a reset in response to a drop in voltage on Power Supply 203. Alternatively, Security Circuit 207 may inhibit operation of Circuit Block 202 during a power up operation until power detection circuit 205 detects a valid voltage level on Power Supply 203.

During a power-up operation of a computing system, different power supplies may be ready, i.e., at their respective desired voltage levels, at different times. For example, in the present embodiment, Power Supply 204 may reach is desired voltage level before Power Supply 203. During the period of time when the voltage level of Power Supply 203 has not yet achieved its desired level, data being received from Circuit Block 201 may be suspect. Power detection circuit 205 may, in some embodiments, be configured to detect when the voltage level of Power Supply 203 as not yet reached its desired level, and signal to other circuits included in Circuit Block 202 to ignore data received from Circuit Block 201 until the voltage level of Power Supply 203 has reach its desired level.

Although Circuit Block 202 is depicted as including a single power detection circuit, in other embodiments, Circuit Block 202 may include any suitable number of power detection circuits and/or security circuits, each of which is coupled to a different power supply of an associated circuit block included in system 200.

Figure 3:
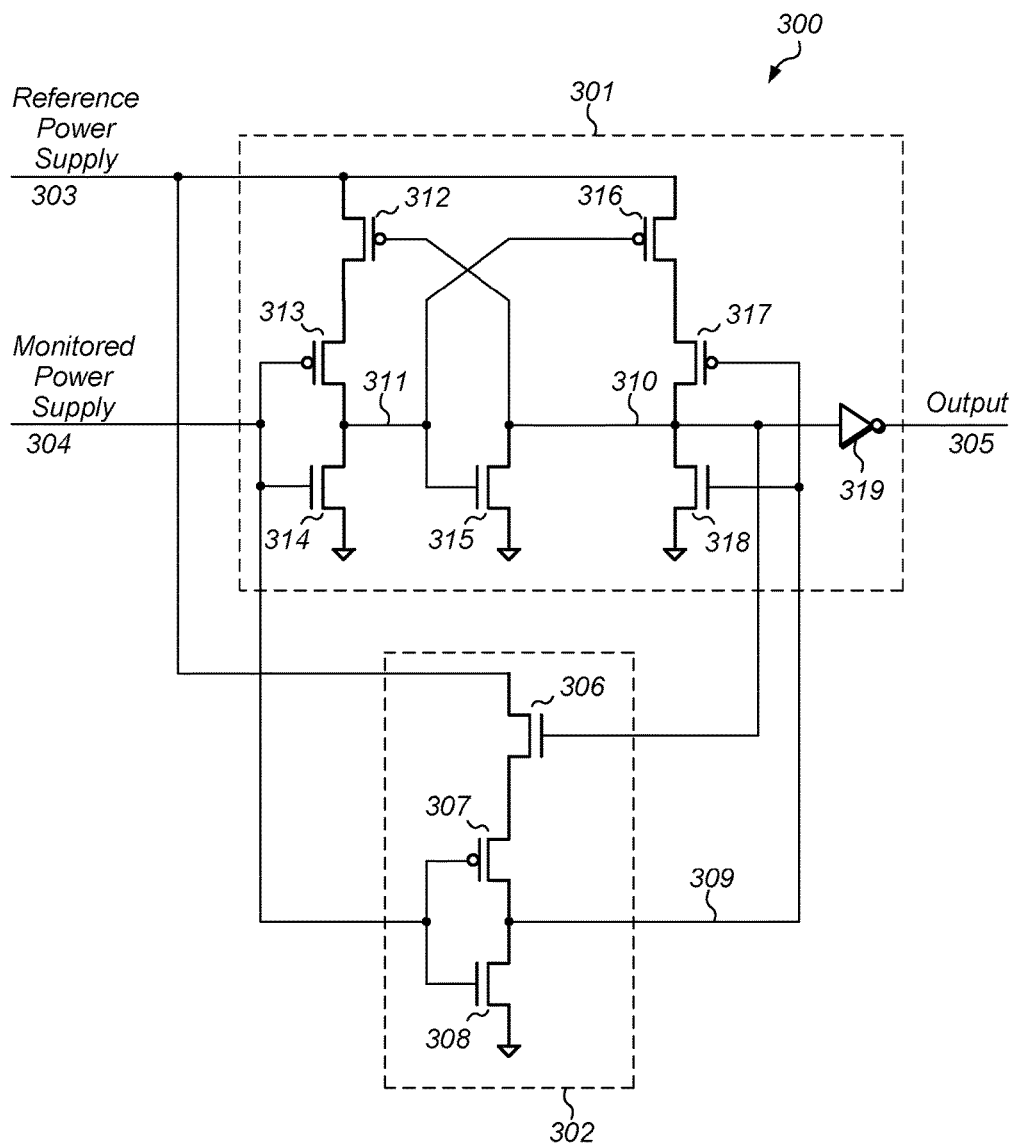
FIG. 3 illustrates an embodiment of a power detection circuit.

Turning to FIG. 3, an embodiment of a power detection circuit is illustrated. In various embodiments, power detection circuit 300 may correspond to power detection circuit 205 as depicted in FIG. 2. Additionally, Reference Power Supply 303 may correspond to Power Supply 204, and Monitored Power Supply 304 may correspond to Power Supply 203. In the illustrated embodiment, power detection circuit 300 includes latch circuit 301 and controlled inverted 302. In various embodiments, latch circuit 301 may also serve as a level shifter in cases where the operating voltage levels of Reference Power Supply 303 and Monitored Power Supply 304 are not the same.

Latch circuit 301 includes transistors 312, 313, 314, 315, 316, 317, and 318, and inverter 319. Source terminals of transistors 312 and 314 are coupled Reference Power Supply 303, and control terminals of transistors 312 and 314 are coupled to circuit nodes 310, and 311, respectively. The drain terminal of transistor 312 is coupled to the source terminal of transistor 313, whose drain terminal is coupled to circuit node 311 and the drain terminal of transistor 314. The source terminal of transistor 314 is coupled to a ground supply.

The control terminals of transistors 313 and 314 are coupled to Monitored Power Supply 304, and the control terminal of transistor 315 is coupled to circuit node 311. The source terminal and the drain terminal of transistor 315 are coupled to the ground supply and circuit node 310, respectively.

The drain terminal of transistor 316 is coupled to the source terminal of transistor 317, whose drain terminal is coupled to circuit node 310. The drain terminal of transistor 318 is also coupled to circuit node 310, and the source terminal of transistor 318 is coupled to the ground supply. The control terminals of transistors 317 and 318 are each coupled to circuit node 309. An input of inverter 319 is coupled to circuit node 310, and an output of inverter 319 is coupled to Output 305.

It is noted that transistors 314, 315, 318, 306, and 308 may, in some embodiments, be an n-channel metal-oxide semiconductor field-effect transistor (MOSFET), and transistors 312, 316, 313, 317, and 307 may be a p-channel MOSFET. It is noted, however, that, in other embodiments, any of the aforementioned transistors may be any suitable transconductance device.

It is noted that static complementary metal-oxide semiconductor (CMOS) inverters, such as inverter 319, may be particular embodiments of inverting amplifiers that may be employed in the circuits described herein. In other embodiments, however, any suitable configuration of inverting amplifier that is capable of inverting the logical sense of a signal(s) and performing logical work may be used including inverting amplifiers built using technology other than CMOS.

Controlled inverter 302 includes transistors 306, 307, and 308. The source terminal of transistor 306 is coupled to Reference Power Supply 303, and the drain terminal of transistor 306 is coupled the source terminal of transistor 307. The drain terminals of transistors 307 and 308 are each coupled to circuit node 309, and the control terminals of transistors 307 and 308 are each coupled to Monitored Power Supply 304.

During operation, a high on Monitored Power Supply 304 activates transistor 314, resulting in a low on circuit node 311. At the same time, the high on Monitored Power Supply 304 activates transistor 308, resulting in a low on circuit node 309. The lows on circuit nodes 309 and 311, activate transistors 317 and 316, respectively, resulting in a high on circuit node 310. Inverter 319 propagates the high on circuit node 310 to a low on Output 305. The feedback provided by the cross-coupling of the control terminals of transistors 312 and 316 to circuit nodes 310 and 311, respectively, assists in latch circuit 301 storing logic values on circuit nodes 310 and 311. Since circuit nodes 310 and 311 maintain a respective logic states during quiescent operation they may be referred to as "storage nodes."

If, during operation, the voltage level on Monitored Power Supply 304 drops below a threshold level, which is dependent upon characteristics of transistors 313 and 314, transistor 313 will activate and transistor 314 will deactivate. It is noted that by adjusting the size or other electrical characteristics of transistors 313 and 314 (as well as transistors 307 and 308), the threshold level at which latch circuit 301 stores a new value may be adjusted. The change in the voltage level on Monitored Power Supply 304 also results in transistor 307 activating and transistor 308 deactivating, thereby charging signal 309 to a high logic level.

When transistor 313 activates, circuit node 311 is charged to a high logic level. Moreover, the high logic level on signal 309 activates transistor 318 and deactivates transistor 317, resulting in circuit node 310 being discharged to a low logic level. As above, the cross-coupling of the control terminals of transistors 312 and 316 assist in maintaining the new stored values. Inverter 319 may then transition Output 305 to a high logic level in response to the change in the value of circuit node 310 to a low logic level.

Output 305 may be used by other circuitry, such as what may be included in Circuit Block 202 or Security Circuit 207, to trigger actions within Circuit Block 202 or system 200. For example, when power detection circuit 300 is configured to detect a drop in the voltage level of Monitored Power Supply 304, a high logic level on Output 305 may trigger a reset or lockout operation within Circuit Block 202 or system 200.

As used and described herein, a "low" or "low logic level" refers to a voltage at or near ground and that "high" or "high logic level" refers to a voltage level sufficiently large to turn on a n-channel MOSFET and turn off a p-channel MOSFET. In other embodiments, different technology may result in different voltage levels for "low" and "high."

As described below in more detail, power detection circuit 300 may be included in a standard cell library for use for with integrated circuit design tools. In various embodiments, a behavioral description of a power detection function may be included in hardware description language (HDL) code for a particular circuit block in an integrated circuit. The integrated circuit design tools may use data associated with the power detection circuit 300 in the standard cell library when implementing the particular circuit block.

Although the present embodiment is configured to detect a drop in the voltage level of Monitored Power Supply 304, in other embodiments, different numbers and arrangements of transistors may be employed to detect when Monitored Power Supply 304 reaches a desired level during a power up operation.

Figure 4:
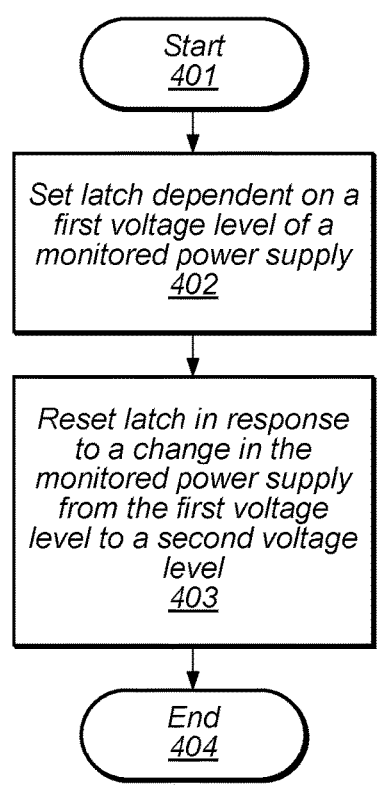
FIG. 4 illustrates a flow diagram depicting an embodiment of a method for operating a power detection circuit.

A flow diagram depicting an embodiment of a method for operating a power detection circuit is illustrated in FIG. 4. Referring collectively to the embodiment depicted in FIG. 3, and the flow diagram of FIG. 4, the method begins in block 401.

Latch 301 may then be set based on a first voltage level of Monitored Power Supply 304 (block 402). As described above in regard to FIG. 3, a high logic value on Monitored Power Supply 304 may store a value low logic value on circuit node 311. Controlled inverter 302 may generate a low logic value on signal 309 in response to the high logic level on Monitored Power Supply 304. Transistors 316 and 317 may charge circuit node 310 to a high logic value in response to the low logic value on signal 309.

Latch 301 may then be re-set, i.e., the storage value changed to the complementary logic state, in response to a change the voltage level of Monitored Power Supply 304 (block 403). The voltage level of Monitored Power Supply 304 may transition from a high logic value to a low logic value, and in response to that change, circuit node 311 may be charged to a high logic value. Moreover, signal 309 may transition to a high logic value, which, in turn, activates device 318 thereby discharging circuit node 310 to a low logic value. Output 305 may then transition to a high logic value in response to the low logic value on circuit node 310.

Device 306 may be deactivated in response to the low logic value on circuit node 310. When device 306 is deactivated, the connection to Reference Power Supply 303 for controlled inverter 302 is severed. By disconnecting controlled inverter from Reference Power Supply 303 in this manner, leakage current from Reference Power Supply 303 through controlled inverter 302 may be minimized, in some embodiments. The method may then conclude in block 404.

Although the operations illustrated in the flow diagram of FIG. 4 are depicted as being performed in a sequential fashion, in other embodiments, one or more of the operations may be performed in parallel.

When power is initially supplied to an SoC (commonly referred to as a "power up operation"), power management circuits and voltage regulators begin to generate the various voltages used to operate the circuit blocks included in the SoC. In some cases, some power supplies are generated by further regulating previously generated supplies. As such, not all power supply voltage levels may be available at the same time.

The differences in time between when the various power supplies have reached their desired voltage levels may cause indeterminate results to be output from some circuit blocks. If a particular circuit block is waiting for signals or data from another circuit block whose supply is not yet at its desired voltage level, the particular circuit block may ignore the signals and data until the another circuit block's power supply is ready.

Figure 5:
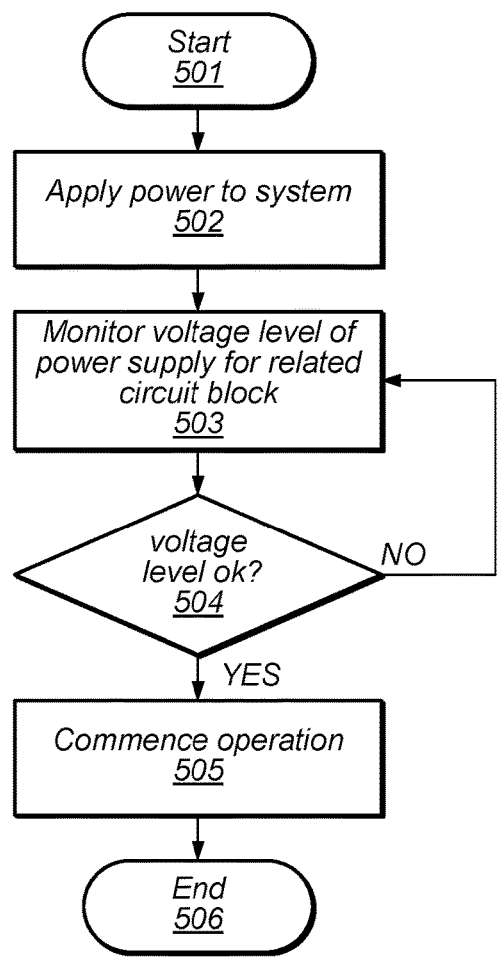
FIG. 5 illustrates a flow diagram depicting an embodiment of a method for a power up operation.

Turning to FIG. 5, a flow diagram illustrating an embodiment of a method for performing a power up operation is depicted. Referring collectively the embodiment illustrated in FIG. 2, and the flow diagram of FIG. 5, the method begins in block 501.

Power may then be applied to an integrated circuit or SoC (block 502). In various embodiments, one or more regulation or power management circuits may begin to generate voltages on the internal power supplies of the integrated circuit or SoC.

Power detection circuit 205 may then be employed to monitor the voltage level of Power Supply 203 (block 503). As described above, a latch included in power detection circuit 205 may be set when a voltage level of Power Supply 204 achieves its desired level. The method may then depend on a voltage level of Power Supply 203 (block 504). If the voltage level of Power Supply 203 is insufficient to trigger the latch in power detection circuit 205 to store a new value, then the method may continue from block 503 as described above.

Alternatively, if the voltage level of Power Supply 203 has reached a level sufficient to trigger the latch in power detection circuit 205 to store a new value, Circuit Block 202 may commence operation (block 505). In various embodiments, Circuit Block 202 may be held in reset until an output of power detection circuit 205 transitions in response to the voltage level of Power Supply 203 reaching its desired level. Alternatively, or additionally, the output of power detection circuit 205 may be used to disable input circuits (not shown) in Circuit Block 202 until the desired voltage level of Power Supply 203 is achieved. Once the desired voltage level has been achieved, the input circuits may be enable and/or the reset for Circuit Block 202 de-asserted.

It is noted that the embodiment of the method illustrated in the flow diagram of FIG. 5 is merely example. In other embodiments, different operations and different orders of operations may be employed.

Figure 6:
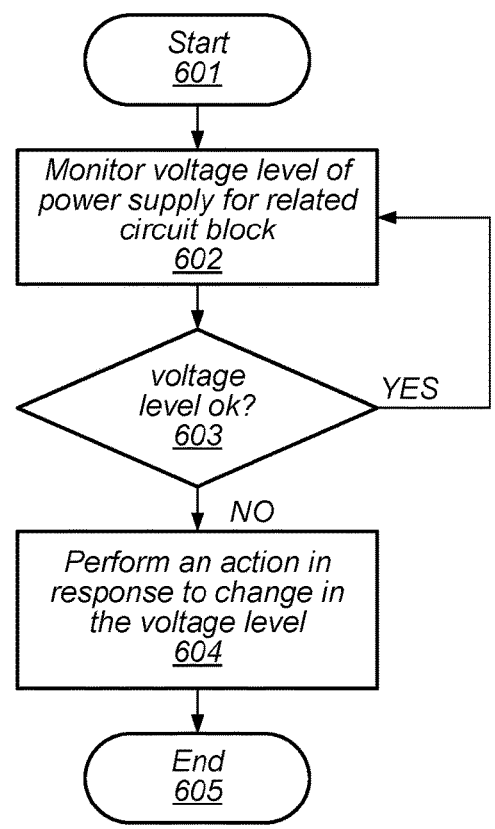
FIG. 6 illustrates a flow diagram depicting an embodiment of a method for detecting a power failure.

In some cases, a sudden drop in the voltage level of a power supply to a particular circuit block included in an SoC may signal a problem with a power supply or voltage regulator circuit, or an attempt to force the SoC into an undesirable operational mode as part of attempted "hack." As a precaution to such events, some SoCs may include one or more security circuits than include power supply voltage detector circuits, such as, e.g., detector circuit 300 as illustrated in FIG. 3. Such detector circuits may be employed to detect changes in the voltage levels of power supplies coupled to certain circuit blocks, and trigger various actions in response to such a change. A flow diagram illustrating an embodiment of a method for detecting such a power failure is depicted in FIG. 6. Referring collectively to FIG. 2 and the flow diagram of FIG. 6, the method begins in block 601.

Detector Circuit 205 of Circuit Block 202 may then monitor the voltage level of power supply 203 (block 602). Power supply 203 may provide power to sub-circuits included in Circuit Block 201. Detector circuit 205 may include a latch and a controlled inverter as illustrated in the embodiment of FIG. 3. In various embodiments, the level latch may be set in response to the voltage level of power supply 203 reaching a desired level after power on.

The method may then depend on the value of the voltage level of power supply 203 (block 603). If the voltage level is greater than or equal to a predetermined value, the method may proceed from block 602 as described above.

Alternatively, if the voltage level of power supply 203 is less than the predetermined value, then Security Circuit 207 may initiate a response to the change in the voltage level of Power Supply 302 (block 604). Security Circuit 207 may issue a reset to the SoC, or disable one or more other circuit blocks from operating until the voltage level of Power Supply 302 returns to nominal operating level. In some embodiments, Security Circuit 207 may blow fuses (not shown) or set state in a non-volatile storage medium (also not shown) and initiate a complete shutdown of the SoC. The blown fuses or set state may prevent a restart of the SoC, resulting in what is commonly referred to as "bricking" the device. The method may then conclude in block 605.

It is noted that the operations illustrated in the flowchart of FIG. 6 are depicted as being performed in a sequential fashion. In other embodiments, one or more of the illustrated options may be performed in parallel.

Figure 7:
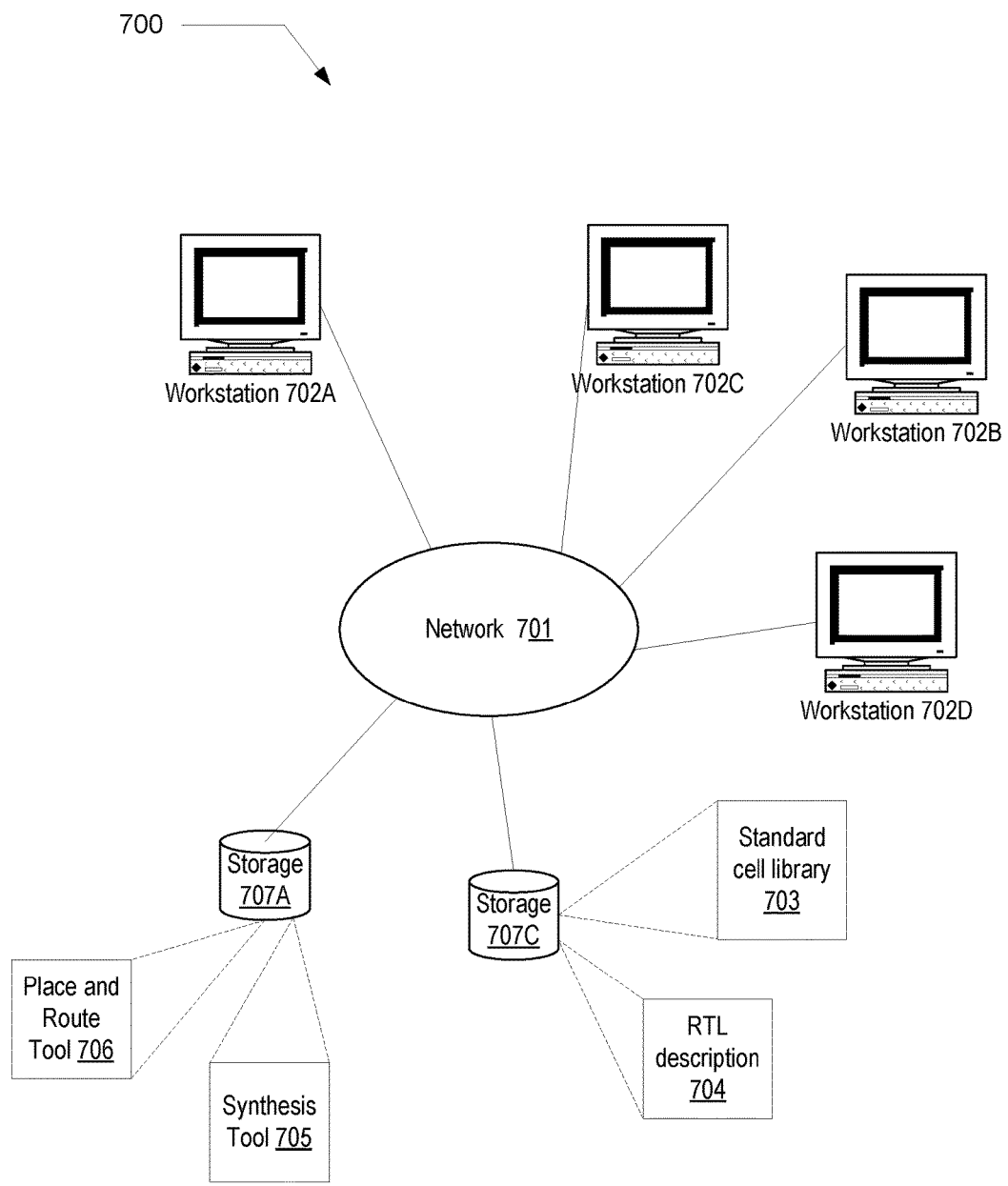
FIG. 7 illustrates an embodiment of a computing system.

When designing an integrated circuit, a register-transfer level (RTL) of each circuit block included within the integrated circuit may be generated. Using various computer-aided design (CAD) tools and a computing system, the RTL for a particular circuit block may be translated into mask design data and netlist data for the particular circuit block. Turning to FIG. 7, a block diagram of one embodiment of a computing system including CAD tools is illustrated. The computing system 700 includes a plurality of workstations designated 702A through 702D. The workstations are coupled together and to a plurality of storage devices designated 707A through 707B through a network 701. In one embodiment, each of workstations 702A-702D may be representative of any standalone computing platform that may include, for example, one or more processors, local system memory including any type of random access memory (RAM) device, monitor, input/output (I/O) means such as a network connection, mouse, keyboard, monitor, and the like (many of which are not shown for simplicity).

In one embodiment, storage devices 707A-707C may be representative of any type of mass storage device such as hard disk systems, optical media drives, tape drives, ram disk storage, and the like. As such, program instructions comprising the design tools such as the place and route tool may be stored within any of the storage devices 707A-707B and loaded into the local system memory of any of the workstations during execution. As an example, as shown in FIG. 7, synthesis tool 705, and place and route tool 706 are shown stored within storage device 707A, while a RTL description 704 and a standard cell library 703 are stored within storage device 1207B.

In addition to circuits configured to implement basic Boolean functions, such as, e.g., AND, OR, XOR, and the like, standard cell library 703 may include a power detection circuit such as, e.g., power detection circuit 300 as illustrated in FIG. 3. Standard cell library 703 may include a logic view (a truth table or state transition table), a transistor-level netlist, and mask design data for the power detection circuit. In some embodiments, standard cell library 703 may also include timing information for the power detection circuit.

In various embodiments, a RTL description of a circuit block included within an integrated circuit may include a description of power detection functionality. When the RTL is processed by synthesis tool 705, the power detection circuit included in standard cell library 703 may be selected to implement the described power detection functionality. Place and route tool 706 may use the mask design data for the power detection circuit included in standard cell library 703 in implementing the mask design for the circuit block.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. An apparatus, comprising:
   an inverter coupled to a first power supply, wherein the inverter is configured to generate a signal dependent upon a second power supply; and
   a latch configured to:
   store a first value dependent upon a first voltage level of the second power supply and a first value of the signal; and
   store a second value dependent upon a second voltage level of the second power supply and a second value of the signal, wherein the second value of the signal is different from the first value of the signal.

2. The apparatus of claim 1, wherein the first voltage level of the second power supply is greater than the second voltage level of the second power supply.

3. The apparatus of claim 1, wherein the first voltage level of the second power supply is less than the second voltage level of the second power supply.

4. The apparatus of claim 1, wherein a third voltage level of the first power supply is greater than the first voltage level of the second power supply.

5. The apparatus of claim 1, wherein the inverter includes a field effect transistor whose source terminal is coupled to the first power supply and whose control terminal is coupled to a storage node in the latch.

6. The apparatus of claim 1, wherein the latch includes a first device and a second device, wherein control terminals of the first and second devices are coupled to the second power supply, and wherein the latch further includes a third and fourth devices, wherein control terminals of the third and fourth devices are coupled to the signal.

7. A method, comprising:
   setting a latch circuit based on a first voltage level of a first power supply, wherein the latch circuit is coupled to a second power supply different from the first power supply;
   re-setting the latch circuit based on a second voltage level of the first power supply, wherein the second voltage level of the first power supply is different than the first voltage level of the first power supply; and
   disabling input to a circuit block that includes the latch circuit, in response to re-setting the latch circuit based on the second voltage level of the first power supply.

8. The method of claim 7, wherein the first voltage level of the first power supply is greater than the second voltage level of the first power supply.

9. The method of claim 7, wherein the first voltage level of the first power supply is less than the second voltage level of the first power supply.

10. The method of claim 7, further comprising signaling a reset condition to a computing system in response to re-setting the latch circuit based on the second voltage level of the first power supply.

11. The method of claim 7, further comprising disabling a computing system in response to re-setting the latch circuit based on the second voltage level of the first power supply.

12. A system, comprising:
a first circuit block coupled to a first power supply; and
a second circuit block coupled to the first circuit block and a second power supply, wherein the second circuit block includes a power detection circuit configured to:
set a latch based on a first voltage level of the first power supply;
re-set the latch based on a second voltage level of the first power supply, wherein the second voltage level of the first power supply is different than the first voltage level of the first power supply; and
disable at least one input to the second circuit block, in response to re-setting the latch.

13. The system of claim 12, wherein the first voltage level of the first power supply is greater than the second voltage level of the first power supply.

14. The system of claim 12, wherein the first voltage level of the first power supply is less than the second voltage level of the first power supply.

15. The system of claim 12, wherein the power detection circuit is further configured to signal a reset condition to the system in response to re-setting the latch.

16. The system of claim 12, wherein the power detection circuit is further configured to disable the system in response to re-setting the latch.

* * * * *